United States Patent
Ker et al.

(10) Patent No.: US 7,532,034 B2
(45) Date of Patent: May 12, 2009

(54) MIXED VOLTAGE INPUT/OUTPUT BUFFER HAVING LOW-VOLTAGE DESIGN

(75) Inventors: Ming-Dou Ker, Hsinchu (TW); Shih-Lun Chen, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/489,325

(22) Filed: Jul. 19, 2006

(65) Prior Publication Data
US 2007/0273404 A1   Nov. 29, 2007

(30) Foreign Application Priority Data
May 25, 2006   (TW) .............. 95118536 A

(51) Int. Cl.
H03K 19/0175 (2006.01)
H03K 19/00 (2006.01)
H03K 10/02 (2006.01)

(52) U.S. Cl. ............... 326/81; 326/58; 326/80; 326/82; 326/83; 326/86; 326/57; 327/534

(58) Field of Classification Search ............ 326/81, 326/58; 327/534
See application file for complete search history.

(56) References Cited

U.S. PATENT DOCUMENTS

| | | | |
|---|---|---|---|
| 5,418,476 A | 5/1995 | Strauss | |
| 5,635,860 A | 6/1997 | Westerwick | |
| 6,147,511 A | 11/2000 | Patel et al. | |
| 6,252,422 B1 | 6/2001 | Patel et al. | |
| 6,583,646 B1 | 6/2003 | Patel et al. | |
| 6,838,908 B2 * | 1/2005 | Ker et al. | 326/83 |
| 6,927,602 B2 * | 8/2005 | Ker et al. | 326/81 |

OTHER PUBLICATIONS

M. J. M. Pelgrom and E. Dijkmans, "A ⅗ V compatible I/O buffer," IEEE J. Solid-State Circuits, vol. 30, pp. 823-825, Jul. 1995.
M. Takahashi et al., "3.3V-5V compatible I/O circuit without thick gate oxide," IEEE Custom Integrated Circuits Conference, 1992, pp. 23.3.1-23.3.4.

* cited by examiner

*Primary Examiner*—Rexford Barnie
*Assistant Examiner*—Matthew C Tabler
(74) *Attorney, Agent, or Firm*—Bucknam and Archer

(57) ABSTRACT

A mixed-voltage input/output buffer having low-voltage design comprises a pre-driver, a tracking unit, a driving unit, and input/output pad, a floating-well unit and a transporting unit. The pre-driver receives first data signal and enable signal and outputs first and second data voltages. The tracking unit provides Gate-Tracking function. The driving unit couples the pre-driver and the tracking unit for production of a first buffer voltage corresponding to the first data voltage. The input/output pad couples the driving unit to output a first buffer voltage and to receive a second data signal. The output unit is used for outputting a second buffer voltage corresponding to the second data signal. The floating-well unit couples to the driving unit and the input/output pad in order to output first buffer voltage and receive second data signal. The floating-well unit is used for preventing leakage current.

2 Claims, 5 Drawing Sheets

MIXED VOLTAGE INPUT/OUTPUT BUFFER HAVING LOW-VOLTAGE DESIGN

TECHNICAL FIELD

The present invention relates to a mixed-voltage input/output buffer, and particularly to a mixed-voltage input/output buffer with low-voltage design.

BACKGROUND OF THE INVENTION

Nowadays, the size for transistor is approaching to the nano domain. In the nano scale, the power supply voltage of chip is reduced; obviously, the reduction of device size not only makes the chip area smaller to save the silicon cost, but also the lower supply voltage will consume lower power. Thus, the chip design is rapidly migrating to the nano-scale low-voltage level for CMOS technology. However, some peripheral components and other ICs are still operating in high voltage level, such as 3.3V or 5V. In other words, the electric system has to provide with the chips operating in different voltages. In order for the compatibility of chips with different voltage levels, the input/output buffer in prior art was not suitable, and caused some problems, such as the reliability problem for gate oxide layer, deterioration of thermal carriers, and generation of undesired current leakage path.

FIG. 1 is a circuit diagram for the conventional tri-state input/output buffer in mixed-voltage interface. The input/output buffer was subjected to current leakage, and the reliability problem of gate oxide layer. In the receiving mode, the gate voltage for the pull-up P-type MOS transistor T1 and the pull-down N-type MOS transistor T2 in the conventional tri-state buffer was biased by the voltage VDD and the ground voltage GND conventionally, and employed the pre-driver U1 to close the pull-up P-type MOS transistor T1 and the pull-down N-type MOS transistor T2. During the receiving mode, the input signal at the input/output pad P11 is raised to two times of voltage VDD, the drain of the pull-up P-type MOS transistor T1 will be forwardly biased to the parasitic PN junction diode D1. Thus, the undesired current leakage path will penetrate the parasitic junction diode, and occur between the input/output pad P1 and the power supply voltage VDD. Moreover, because the gate voltage of the pull-up P-type MOS transistor T1 is biased at the voltage VDD, and the input signal at the input/output pad P11 is with the value two times of voltage VDD, the channel of the pull-up P-type MOS transistor T1 will be opened in the receiving mode to connect another undesired current leakage path from the input/output pad P11 to the power supply voltage VDD, and this undesired current leakage will not only cause more power consumption in the electric system, but also result in possible failure in the whole system. In order to avoid the reliability problem of the gate oxide layer, the devices with the gate oxide layer problems in some mixed input/output pads will replace the devices having overloaded gate oxide layer with the thick oxide layer device. However, it will increase the manufacturing cost for the chip having both the thick oxide layer devices and the thin oxide layer devices.

FIG. 2 is a circuit diagram showing conventional mixed-voltage input/output buffer, in which the transistors 107, 109 and 110 are used to generate the offset voltage to bias the gate of the transistor 108. However, the DC current path in the transistors 107, 109 and 110 existed from voltage VDD to voltage VSS will cause additional power consumption, and using the stacked transistors 101, 102 will reduce the driving capability.

FIG. 3 is a circuit diagram showing further another conventional mixed-voltage input/output buffer, which includes two stacked P-type MOS transistors having large silicon area. Moreover, the transistors 270, 280 using virtual diodes will generate the offset voltage to bias the bulk of the P-type MOS transistors 230, 260. The bulk voltage has a voltage drop. If the bulk voltage clamps the voltage VDD through the transistor 270 and the bulk voltage is resulted from the virtual diode structure, the voltage will be the voltage VDD minus the threshold voltage Vt, and this low body voltage will result in large amount of subthreshold current leakage of transistors 230, 260.

FIG. 4 is a circuit diagram showing a conventional mixed-voltage input/output buffer, in which the additional pad P41 and the additional offset voltage V41 (voltage of V41 is 5V) are used for the bulk of the biased P-type MOS transistor 401. Moreover, the P-type MOS transistor 401 is a thick oxide layer (high voltage) device for preventing the reliability problem of the gate oxide layer, which will result in more cost and larger silicon area. And, using high voltage (5V) for biasing the body will deteriorate the driving capacity of the transistor 402 due to the bulk bias effect.

FIG. 5 is a circuit diagram showing another conventional mixed-voltage input/output buffer. The current employs the feedback technique to control the voltage of the bulk 242 and the gate voltage of the transistor 232 for the P-type MOS transistor. When the buffer driving voltage VDD is the output voltage, the voltage of the body for the P-type MOS transistor is the bias current value VDD minus from the threshold voltage Vt, it will result in large amount of sub-threshold current leakage.

FIG. 6 is a circuit diagram showing another conventional voltage input/output buffer, in which the body voltage of the P-type MOS transistor 321 is the offset voltage VDD minus from the threshold voltage Vt. Moreover, when the input/output buffer is receiving a high input voltage, the base voltage of the P-type MOS transistor will be biased through the parasitic diode 322, and further result in the occurrence of large amount of sub-threshold current leakage.

SUMMARY OF INVENTION

The object of the present invention is to provide a mixed-voltage input/output buffer, which could be applied in a nano processor, and be composed of low voltage devices, and could prevent the undesired current leakage, the sub-threshold current leakage, and eliminate the reliability problem of gate oxide layer.

The present invention provides a mixed-voltage input/output buffer, which comprises a pre-driver, a tracking unit, a driving unit, and an input/output pad, a floating-well unit, and a transporting unit; wherein, the pre-driver receives a first data signal and an enable signal from an external unit, and outputs first and second data voltages; the tracking unit includes a switch device and a plurality of transistors providing the gate-tracking function, and these transistors are used to prevent the occurrence of current leakage in the switch device and the driving unit; the driving unit is used to generate a first buffer voltage corresponding to the first data voltage; the input/output pad is coupled with the driving unit to output a first buffer voltage to another external unit, and to receive a second data signal from an external unit, and the driving unit has a well as the substrate of the transistors in the driving unit; the transporting unit is used to output a second buffer voltage corresponding to the second data signal; and, the floating-well unit is coupled to the driving unit and the input/output pad for preventing current leakage in the well of the driving unit.

The present invention employs the composite structure by the tracking unit, the floating-well unit and the driving unit to eliminate the current leakage, so it could prevent the reliability problem of the gate oxide layer, avoid the undesired current leakage and the sub-threshold current leakage, and it employs the low voltage devices and is suitable for nano process.

The objects, features, advantages and others of the present invention will become more apparent from the following detailed description in which reference is made to some embodiments of the invention and the appended drawings.

DETAILED DESCRIPTION OF PREFERRED EMBODIMENTS

Figure 1:
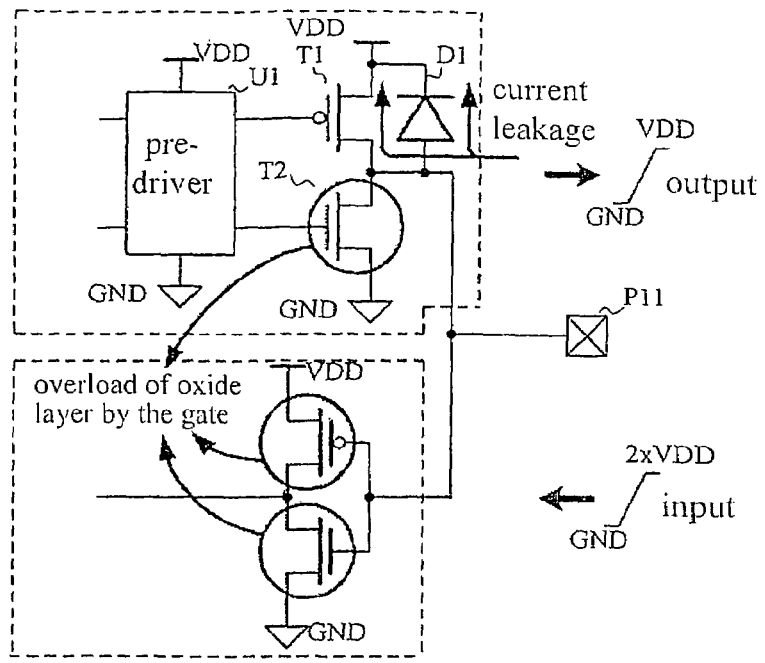
FIG. 1 is a circuit diagram for a conventional tri-state input/output buffer.
Figure 2:
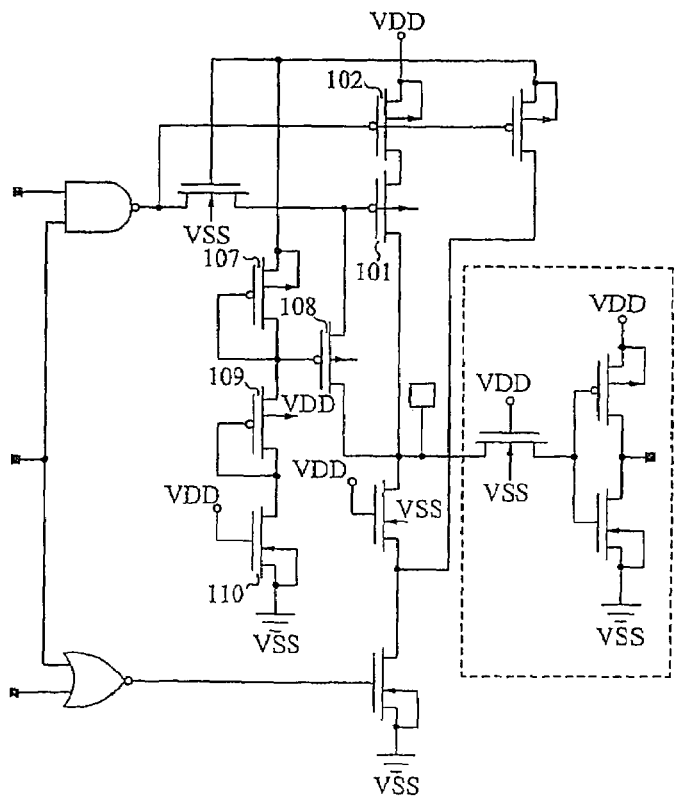
FIG. 2 is a circuit diagram for conventional mixed-voltage input/output buffer.
Figure 3:
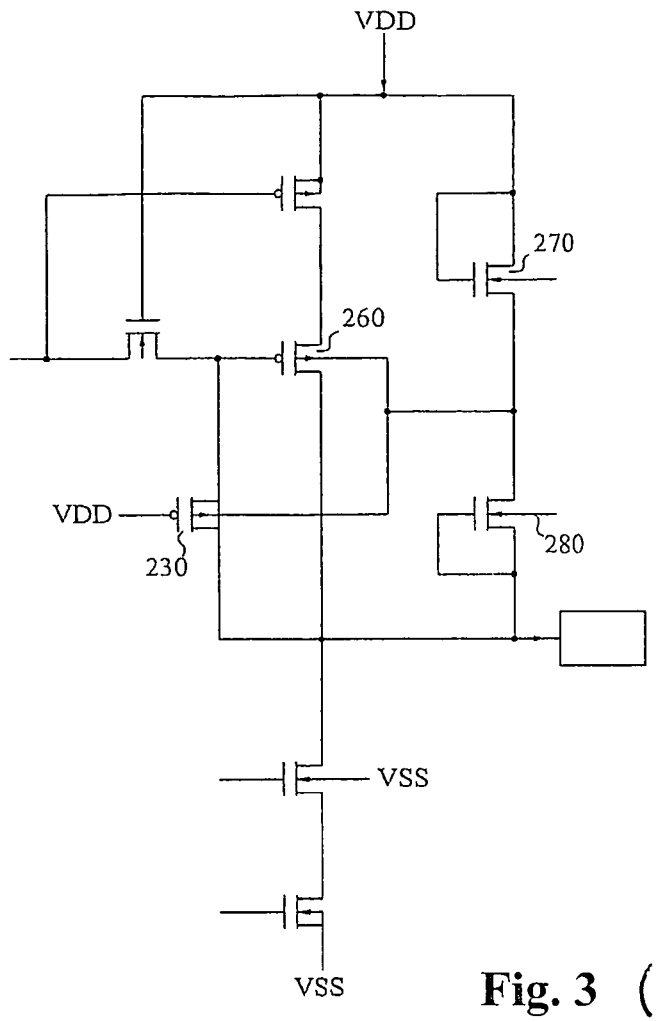
FIG. 3 is a circuit diagram for another conventional mixed-voltage input/output buffer.
Figure 4:
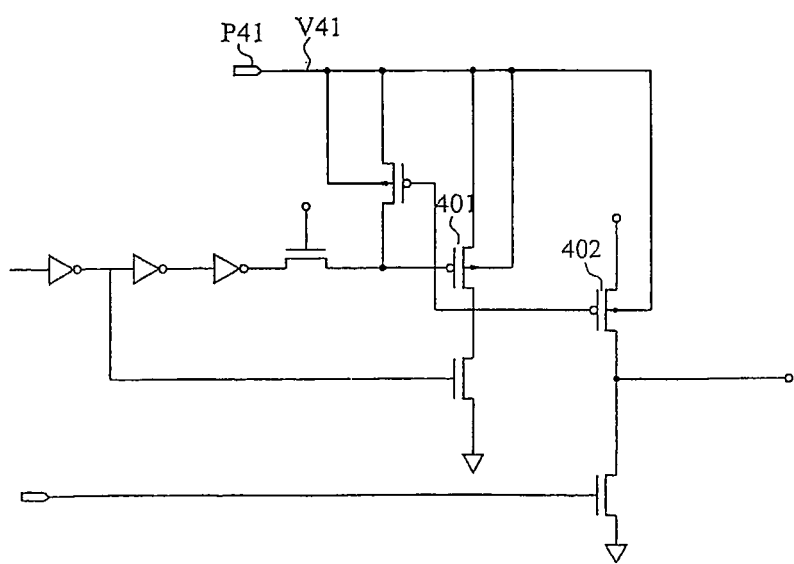
FIG. 4 is a circuit diagram for another conventional mixed-voltage input/output buffer.
Figure 5:
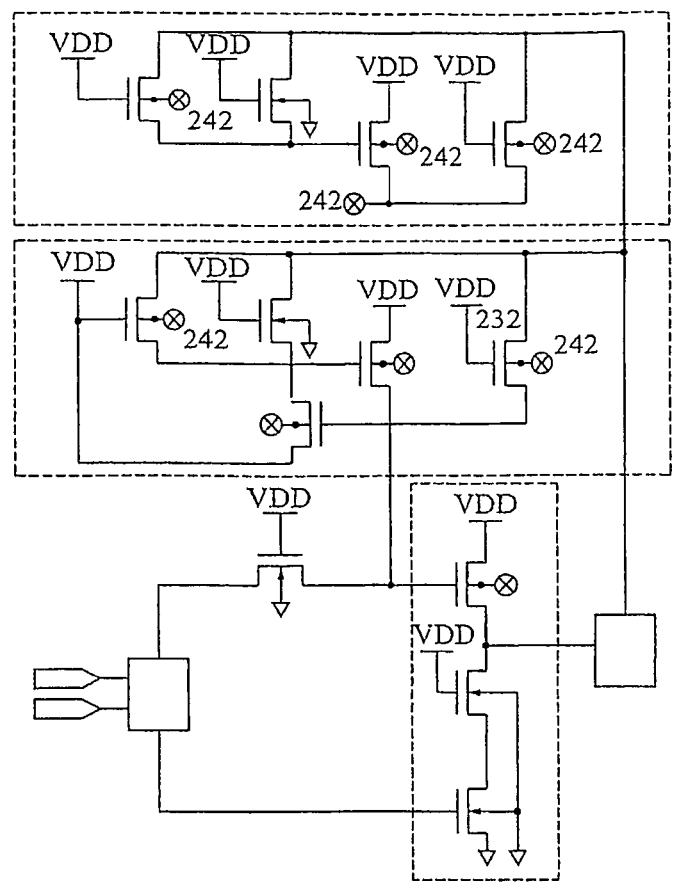
FIG. 5 is a circuit diagram for another conventional mixed-voltage input/output buffer.
Figure 6:
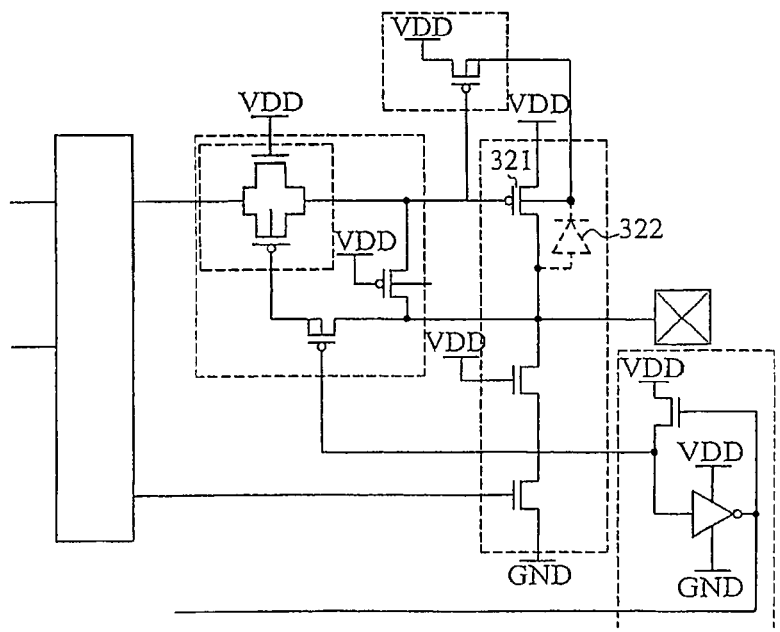
FIG. 6 is a circuit diagram for another conventional mixed-voltage input/output buffer.
Figure 7:
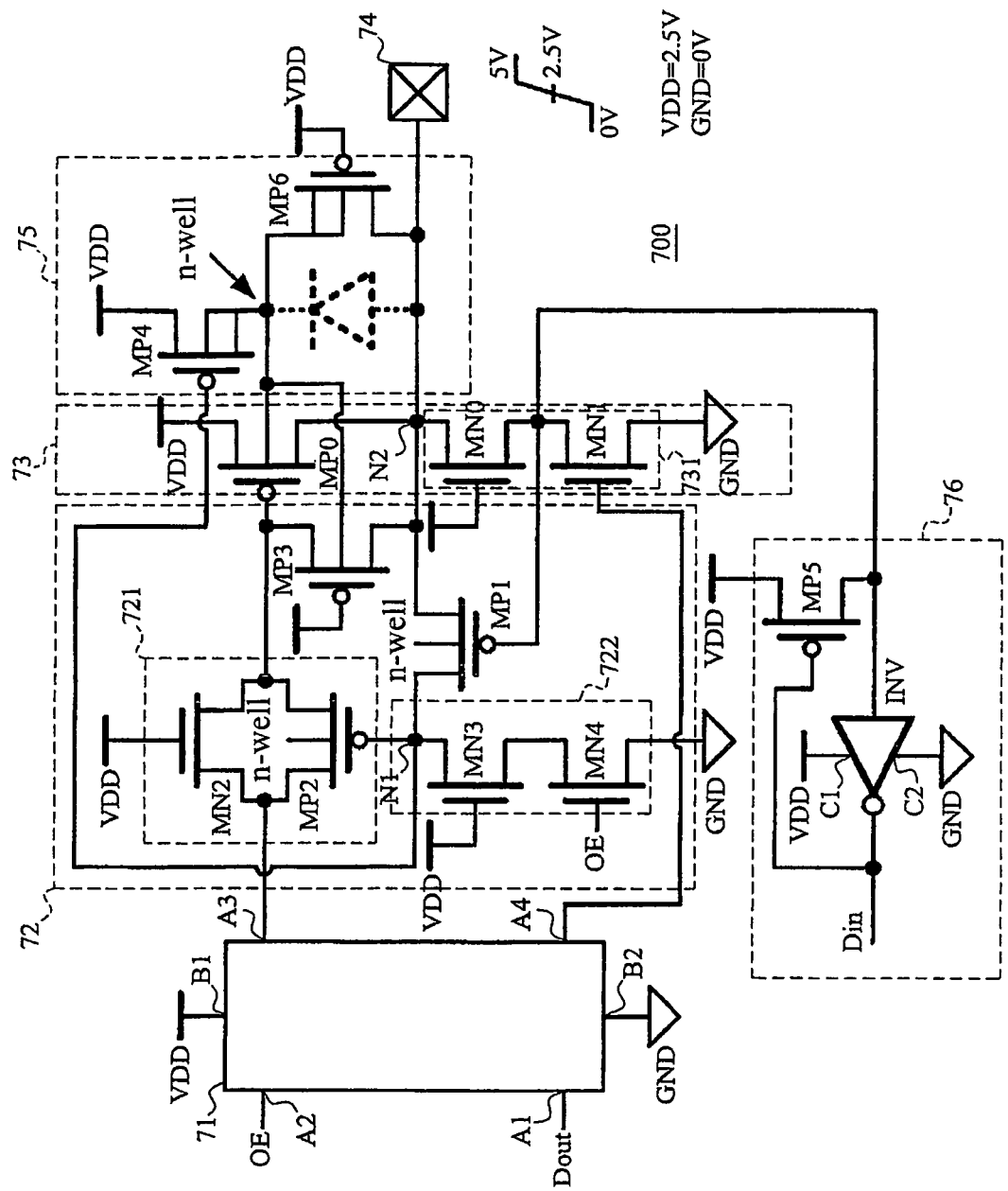
FIG. 7 is a circuit diagram for a mixed-voltage input/output buffer 700 in an embodiment according to the present invention.

Now, please refer to FIG. 7 to describe the aspects of the present invention. FIG. 7 is a circuit diagram showing the mixed-voltage input/output buffer 700 having low-voltage design in an embodiment according to the present invention. The mixed-voltage input/output buffer 700 comprises a pre-driver 71, a tracking unit 72, a driving unit 73, input/output pad 74, a floating-well unit 75, and a transporting unit 76. The pre-driver 71 includes a data input terminal A1, a control terminal A2, a higher output port A3, and a lower output port A4, in which the data input terminal A1 of the pre-driver 71 receives a first data signal Dout from an external unit (not shown), and receives the enable signal OE through the control terminal A2. The pre-driver 71 will convert the first data signal Dout and the enable signal OE for outputting a first data voltage and a second data voltage from the higher output port A3 and the lower output port A4, respectively, wherein the first data voltage is corresponding to the first data signal, and the second data voltage will input different voltages to the driving unit 73 based on the input/output status.

The tracking unit 72 is coupled to the pre-driver 71, and comprises a switch device 721, a transistor MP1 (the eighth transistor), a transistor MP3 (the second transistor), and a first stack transistor 722, in which the switch device 721 of the tracking unit 72 has a transistor MN2 and a transistor MP2. The tracking unit 72 is used to provide the gate tracking function. The first stack transistor 722 includes a transistor MN3 (the third transistor), and a transistor MN4 (the fourth transistor), in which the gate of the transistor MN3 is coupled to the voltage VDD, and the gate of the transistor MN4 is coupled to the enable signal OE. The first stack transistor 722 could adjust the voltage at node N1 based on the content of the enable signal OE.

The driving unit 73 is coupled to the pre-driver 71 and the tracking unit 72. The driving unit 73 has a transistor MP0 and a second stack transistor 731. The transistor MP0 (the fifth transistor) is coupled to the second stack transistor 731 through the node N2. The second stack transistor 731 of the driving unit 73 has a transistor MN0 (the sixth transistor) and a transistor MN1 (the seventh transistor) for generating a first buffer voltage corresponding to the first data voltage. The input/output pad 74 is coupled to the driving unit 73 for outputting the first buffer voltage to another external unit (not shown), and receiving the second data signal from another external unit (not shown). The driving unit 73 has a n-well as the substrate of the transistor MP0.

The floating-well unit 75 is coupled to the driving unit 73 and the input/output pad 74. The floating-well unit 75 has a transistor MP4 (the tenth transistor) and a transistor MP6 (the first transistor) for eliminating the possible current leakage in the n-well of the driving unit 73 through the switching operation of the transistor MP4 and the transistor MP6. The transporting unit 76 is coupled to the driving unit 73. The transporting unit 76 has a transistor MP5 (the ninth transistor) and an inverter INV for outputting the second buffer voltage corresponding to the second data signal. Furthermore, the external unit and another external unit have the chip set with different working voltages, respectively.

When the enable signal is at the voltage VDD (logically one), the input/output buffer 700 is operating at the transmit mode. The signal at the input/output pad 74 will be up or down according to the first data signal Dout. The lower output port A4 of the pre-driver 71 is directly connected to the gate of the pull-down N-type MOS transistor MN1, and the higher output port A3 of the pre-driver 71 is connected to the gate of the pull-up P-type MOS transistor MP0 through the switch device 721 of the tracking unit 72. If the voltage level at the higher output port A3 is the ground voltage GND, this signal will be completed transmitted to the gate of the pull-up P-type MOS transistor MP0 through the transistor MN2, that is, the signal at the input/output pad 74 will be pulled up to the voltage VDD. Moreover, the transistor MP4 is also connected to bias the n-well of the driving unit 73 to the voltage VDD. When the voltage level at the lower output port A4 is the voltage VDD, the gate of the transistor MP0 will be charged and connected to the voltage VDD through the transistor MP2, and the n-well of the driving unit 73 will be biased to the voltage VDD through the transistor MP4.

When the input/output buffer 700 is operating in the input (receiving) mode, the higher output port A3 and the lower output port A4 of the pre-driver 71 will be kept at the voltage VDD and the ground voltage GND, respectively, for closing the transistor MP0 and the transistor MN1. The node Din, at the input mode, will be pulled up or pulled down based on the signal at the input/output pad 74. In order to prevent the occurrence of undesired current leakage from the input/output pad 74 to the power supply voltage VDD through the pull-up P-type MOS transistor MP0, the transistor MP3 is used to track the gate voltage of the transistor MP0 at the input/output pad 74. If the transistor level at the input/output pad 74 exceeds VDD+Vtp (Vtp is the threshold voltage of the P-type MOS transistor), such as two times of voltage VDD, the transistor MP3 will be turned on to charge the gate of the transistor MP0 to two times of voltage VDD, so that the current leakage from the input/output pad 74 to the power supply voltage VDD will not occur. Moreover, when the signal at the input/output pad 74 is two times of voltage VDD, the transistor MP1 is also connected to keep the transistor MP2 off, so as to prevent another current leakage occurred from the gate of the transistor MP0 to the higher output port A3 of the pre-driver 71 through the switch device 721.

The transistor MN0 and the transistor MP5 together with the inverter INV are used, in the input mode, to transmit the input signal from the input/output pad 74 to the internal node Din. The transistor MN0 is used to limit the voltage level of input signal at the gate of the inverter INV. Because the gate of the transistor MN0 is coupled to the power supply voltage VDD, when the voltage level of the input/output pad 74 is two times of voltage VDD, the input voltage of the inverter INV will be limited to the voltage VDD minus the threshold voltage Vt (VDD−Vt); and, when the output of the inverter INV is pulled down to the ground voltage GND, the transistor MP5 will pull up the input of the inverter INV to VDD, and the signal at the input/output pad 74 will be successfully transmitted to the internal input node Din.

Figure 8A:
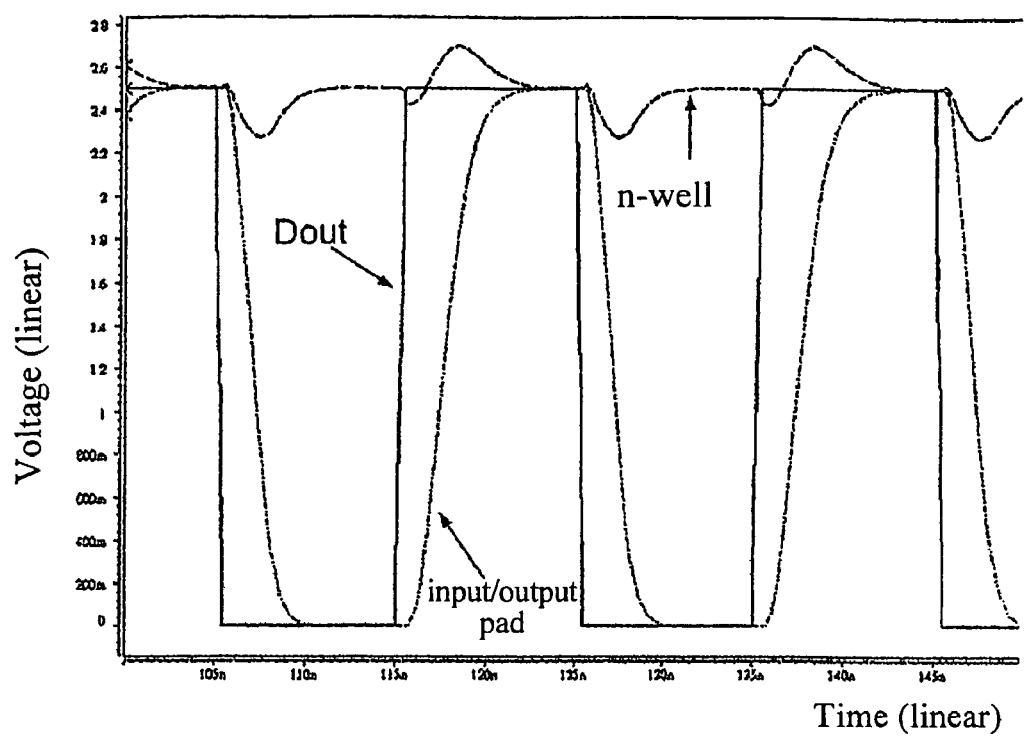
FIG. 8A is a simulated waveform diagram showing the transmit mode of the mixed-voltage input/output buffer in an embodiment according to the present invention.
Figure 8B:
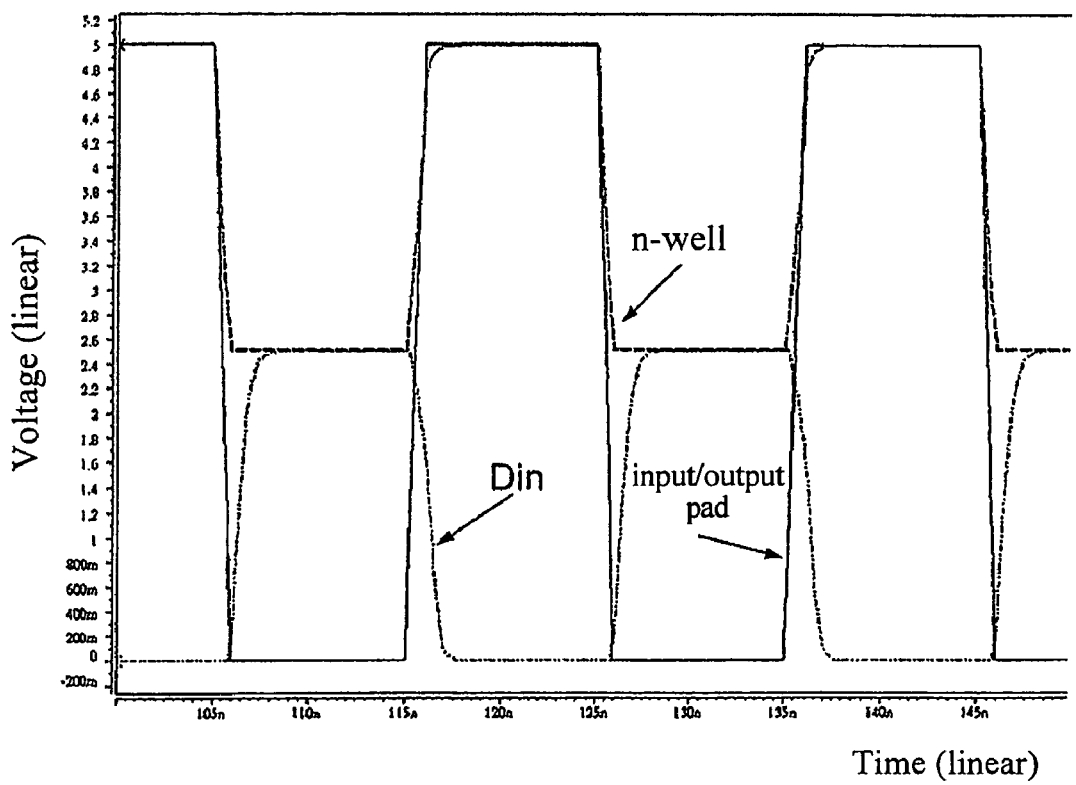
FIG. 8B is a simulated waveform diagram showing the receive mode of the mixed-voltage input/output buffer in an embodiment according to the present invention.

FIG. 8A is a simulated waveform diagram showing the transmit mode of the mixed-voltage input/output buffer in an embodiment according to the present invention. FIG. 8B is a simulated waveform diagram showing the receive mode of the mixed-voltage input/output buffer in an embodiment according to the present invention. For the 0.25 μm 2.5-V CMOS process, as shown in FIGS. 8A and 8B, the voltage of n-well doesn't have any voltage drop, and could be biased to the desired voltage level (2.5V/5V). Thus, the mixed-voltage input/output buffer could operate normally without the problem of reliability of gate oxide layer, the undesired current leakage, and the sub-threshold current leakage.

In a summary, the mixed-voltage input/output buffer according to the present invention provides a structure combining the floating-well unit, the tracking unit, and the driving unit, which could prevent the undesired current leakage, the sub-threshold current leakage, and without the reliability problem for the gate oxide layer for normal operation and suitable for nano-meter process.

Having illustrated and described the embodiments according to the present invention, those skilled in the art will appreciate that these embodiments did not limit the present invention, and numerous changes and modifications may be made to these embodiments of the invention, and that such changes and modifications may be made without departing from the scope and range of the present invention. Therefore, the scope and range of the present invention is defined by the appended claims.

| | |
|---|---|
| 71, U1 | Pre-driver |
| 72 | Tracking unit |
| 73 | Driving unit |
| 74, P11, P41 | Pad |
| 75 | Floating-well unit |
| 76 | Transporting unit |
| 242 | Bulk |
| 721 | Switch |
| 722, 731 | Stack transistor |
| A1 | Input terminal |
| A2 | Control terminal |
| A3, A4 | Output port |
| B1, B2 | Power input |
| C1, C2 | Power input |
| D1 | Parasitic diode |
| Din, N1, N2 | Node |
| GND | Ground voltage |
| INV | Inverter |
| T1, T2, 101 102 | Transistor |
| 107, 109, 110 | Transistor |
| 230, 232, 260 | Transistor |
| 270, 280, 321 | Transistor |
| 322, 401, 402 | Transistor |
| MN0~MN4 | Transistor |
| MP0~MP6 | Transistor |
| OE, Dout | Signal |
| VDD, VSS, V41 | Voltage |

We claim:

1. A mixed-voltage input/output buffer, which comprises:
a pre-driver, for receiving a first data signal and an enable signal from an external unit, and converting the first data signal and the enable signal together to output a first data voltage and a second data voltage;
a tracking unit, for receiving the first data voltage, and providing a gate tracking function, the tracking unit comprising a switch device, a first stack transistor, and a second transistor, in which the tracking unit receives the first data voltage from the pre-driver through the switch device, and inputs the first data voltage to a driving unit; one output of the second transistor is coupled to the driving unit, and another output of the second transistor is coupled to the input/output pad for providing a gate tracking function and preventing the occurrence of current leakage between an input/output pad and the driving unit; the first stack transistor includes a third transistor and a fourth transistor, in which the third transistor is at normal connected state for circuit matching, and the gate of the fourth transistor receives the enable signal for making the first stack transistor outputting a voltage corresponding to the enable signal to a control terminal of a tenth transistor provided in a floating-well unit;
the driving unit, for coupling to the pre-driver and the tracking unit, in which the driving unit receives the first data voltage through the tracking unit for generating a first buffer voltage corresponding to the first data voltage with the gate tracking function, and the driving unit receives the second data voltage, and the second data voltage is used for the conversion of input/output status, and the driving unit includes a well, and the well is used as a substrate for a transistor in the driving unit;
an input/output pad, for coupling to the driving unit to output the first buffer voltage to another external unit, and receive a second data signal from another external unit; and,
a transporting unit, for coupling to the input/output pad and the driving unit to generate and output a second buffer voltage corresponding to the second data signal to the external unit, the mixed-voltage input/output buffer is characterized in having:
a floating-well unit for coupling to the input/output pad and the driving unit, the floating-well unit including a first transistor and a tenth transistor, in which the gate voltage of the tenth transistor can be pulled to 0V by the third transistor and the fourth transistor when the input/output pad is operated in the transmit mode, and one output of the first transistor is coupled to the input/output pad, and another output of the first transistor and the substrate of the first transistor are connected to the well of the driving unit, in which when the voltage of the input/output pad is larger than a predetermined value, increasing the voltage of the well to a predetermined high voltage for preventing the occurrence of current leakage between the well of the driving unit and the input/output pad.

2. A mixed-voltage input/output buffer according to claim 1, in which
one output of the tenth transistor is coupled to a power voltage, and the control terminal of the tenth transistor employs the corresponding voltage control outputted by the first stack transistor to ramp up the voltage for the well of the driving unit to the power voltage to prevent the occurrence of current leakage between the well of the driving unit and the input/output pad.

* * * * *